US008497499B2

(12) United States Patent
Davidovic et al.

(10) Patent No.: US 8,497,499 B2
(45) Date of Patent: Jul. 30, 2013

(54) METHOD TO MODIFY THE CONDUCTIVITY OF GRAPHENE

(75) Inventors: Dragomir Davidovic, Atlanta, GA (US); Walter A. de Heer, Atlanta, GA (US); Christopher E. Malec, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 245 days.

(21) Appl. No.: 12/902,360

(22) Filed: Oct. 12, 2010

(65) Prior Publication Data

US 2011/0108806 A1 May 12, 2011

Related U.S. Application Data

(60) Provisional application No. 61/250,722, filed on Oct. 12, 2009.

(51) Int. Cl.
*H01L 51/00* (2006.01)
(52) U.S. Cl.
USPC ........ 257/40; 257/24; 257/E51.038; 977/788; 977/936
(58) Field of Classification Search
USPC ..................................... 257/24, 40
See application file for complete search history.

(56) References Cited

U.S. PATENT DOCUMENTS

| | | |
|---|---|---|
| 4,898,557 A | 2/1990 | Engemann |
| 5,647,998 A | 7/1997 | Potter |
| 5,993,697 A | 11/1999 | Cohen et al. |
| 6,083,624 A | 7/2000 | Hiura |
| 6,136,160 A | 10/2000 | Hrkut et al. |
| 6,159,558 A | 12/2000 | Wolfe et al. |
| 6,245,417 B1 | 6/2001 | Huang |
| 6,515,339 B2 | 2/2003 | Shin et al. |
| 6,540,972 B1 | 4/2003 | Hiura |
| 6,540,973 B1 | 4/2003 | Sasaki et al. |
| 7,015,142 B2 | 3/2006 | DeHeer et al. |
| 7,327,000 B2 | 2/2008 | DeHeer et al. |

(Continued)

FOREIGN PATENT DOCUMENTS

| | | |
|---|---|---|
| WO | 03018871 A2 | 3/2003 |
| WO | 2005001895 A2 | 1/2005 |

OTHER PUBLICATIONS

Jones, K.A., "Annealing ion implanced SiC with an AlN cap," Materials Science and Engineering B61-62 (1999), pp. 281-286, Elsevier Science S.A.

(Continued)

*Primary Examiner* — Jerome Jackson, Jr.
(74) *Attorney, Agent, or Firm* — Bryan W. Bockhop; Bockhop & Associates, LLC

(57) ABSTRACT

A gated electrical device includes a non-conductive substrate and a graphene structure disposed on the non-conductive substrate. A metal gate is disposed directly on a portion of the graphene structure. The metal gate includes a first metal that has a high contact resistance with graphene. Two electrical contacts are each placed on the graphene structure so that the metal gate is disposed between the two electrical contacts. In a method of making a gated electrical device, a graphene structure is placed onto a non-conductive substrate. A metal gate is deposited directly on a portion of the graphene structure. Two electrical contacts are deposited on the graphene structure so that the metal gate is disposed between the two electrical contacts.

19 Claims, 2 Drawing Sheets

U.S. PATENT DOCUMENTS

| | | | |
|---|---|---|---|
| 7,449,133 | B2 | 11/2008 | Gruner et al. |
| 8,158,968 | B2 * | 4/2012 | Raravikar et al. ............... 257/26 |
| 2002/0014667 | A1 | 2/2002 | Shin et al. |
| 2005/0003574 | A1 * | 1/2005 | Yang et al. ..................... 438/99 |
| 2007/0287011 | A1 | 12/2007 | DeHeer et al. |
| 2009/0072223 | A1 * | 3/2009 | Awano ........................ 257/24 |
| 2009/0226638 | A1 | 9/2009 | DeHeer et al. |
| 2009/0236608 | A1 | 9/2009 | DeHeer et al. |
| 2009/0236609 | A1 | 9/2009 | de Heer et al. |

OTHER PUBLICATIONS

Bachtold et al., "Logic circuits with carbon nanotube transistors," Science (2001), vol. 294, p. 1317.

Charrier et al., "Solid-state decomposition of silicon carbide for growing ultra-thin heteroepitaxial graphite films," Journal of App Physics (2002), p. 2479, vol. 92.

Fuhrer et al., "High-mobility nanotube transistor memory," Nano Letters (2002), p. 755, vol. 2, No. 7.

Javey et al., "Ballistic carbon nanotube field-effect transistors," Nature (2003), p. 654, vol. 424.

Kempa et al., "A field effect transistor from graphite," EPJ Manuscript (2003).

Mintmire et al., "Universal density of states for carbon nanotubes," Physical Review Letters (1998), p. 2506, vol. 81, No. 12.

Nakada et al., "Edge state in graphene ribbons," Physical Review B, (1996), p. 17954, vol. 54, No. 24.

Poncharal et al., "Room temperature ballistic conduction in carbon nanotubes," J. Phys. Chem. B (2002), p. 12104.

Wakabayashi, "Electronic transport properties of nanographite ribbon junctions," Physical Review B (2001), p. 125428-1, vol. 64.

Frank et al., "Carbon nanotube quantum resistors," Science (1998), p. 1744, vol. 280.

Berger et al., "Ultrathin Epitaxial Graphite: 2D Electron Gas Properties and a Route toward Graphene-based Nanoelectronics," J. Phys. Chem. B (2004), vol. 108, pp. 19912-19916.

\* cited by examiner

METHOD TO MODIFY THE CONDUCTIVITY OF GRAPHENE

CROSS-REFERENCE TO RELATED APPLICATION(S)

This application claims the benefit of U.S. Provisional Patent Application Ser. No. 61/250,722, filed Oct. 12, 2009, the entirety of which is hereby incorporated herein by reference.

BACKGROUND OF THE INVENTION

1. Field of the Invention

The present invention relates to graphene devices and, more specifically, to a gated graphene device.

2. Description of the Related Art

Graphene has demonstrated numerous properties that make it suitable as a material for electronics. An important property of graphene is that its conductivity depends on the density of charge carriers (either electrons or holes) in the graphene. For example, when a voltage difference is applied between the ends of a graphene ribbon then a current will flow through the ribbon. The magnitude of the current depends on the density of the charge carriers in the graphene ribbon. This density can be modified using an electrostatic gate that selectively applies an electric field to a portion of the graphene ribbon, thereby modifying the resistance of the graphene ribbon in the vicinity of the gate.

Existing graphene electronic devices typically employ an electrostatic gate that includes a dielectric material that is deposited on a graphene sheet and a metal layer that is deposited on the dielectric material. Applying a potential difference between the metal layer and the graphene ribbon establishes an electric field at the graphene ribbon, which modifies the charge density in the graphene ribbon and its conductivity.

The effectiveness of the electrostatic gate is measured by the magnitude of the potential difference that is required to produce a certain change in the conductivity of the graphene ribbon. Typically, thinner dielectric layers are preferable. However, a dielectric layer that is too thin tends to leak and undesirable current flows from the metal layer to the graphene ribbon.

Applying a dielectric material to the graphene can be difficult because many dielectric materials do not adhere well to graphene. Therefore, graphene is typically modified chemically when applying a dielectric layer thereto. However, such chemical modification can degrade the quality of the graphene. Also, it is difficult to produce sufficiently thin dielectric layers on graphene using most conventional processes. This results in a need for relatively large potential differences to be applied between the gate and the graphene ribbon to produce a suitable gating effect in active graphene electronic devices.

Therefore, there is a need for a method of applying a gate to graphene that does not require application of a dielectric layer.

SUMMARY OF THE INVENTION

The disadvantages of the prior art are overcome by the present invention which, in one aspect, is a gated electrical device that includes a non-conductive substrate and a graphene structure disposed on the non-conductive substrate. A metal gate is deposited directly on a portion of the graphene structure. The metal gate includes a first metal that has a high contact resistance with graphene. Two electrical contacts are each placed on the graphene structure so that the metal gate is disposed between the two electrical contacts.

In another aspect, the invention is a gated electrical device that includes a silicon oxide substrate and a graphene ribbon disposed on the substrate. The graphene ribbon includes at least one layer of graphene. A copper gate layer is deposited directly on a portion of the graphene structure. Two electrical contacts are each placed on the graphene structure so that the metal gate is disposed between the electrical contacts. The electrical contacts include titanium coated with gold.

In yet another aspect, the invention is a method of making a gated electrical device, in which a graphene structure is placed onto a non-conductive substrate. A metal gate is deposited directly on a portion of the graphene structure. The metal gate includes a first metal that has a high contact resistance with graphene. Two electrical contacts are deposited on the graphene structure so that the metal gate is disposed between the two electrical contacts.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

Figure 1A:
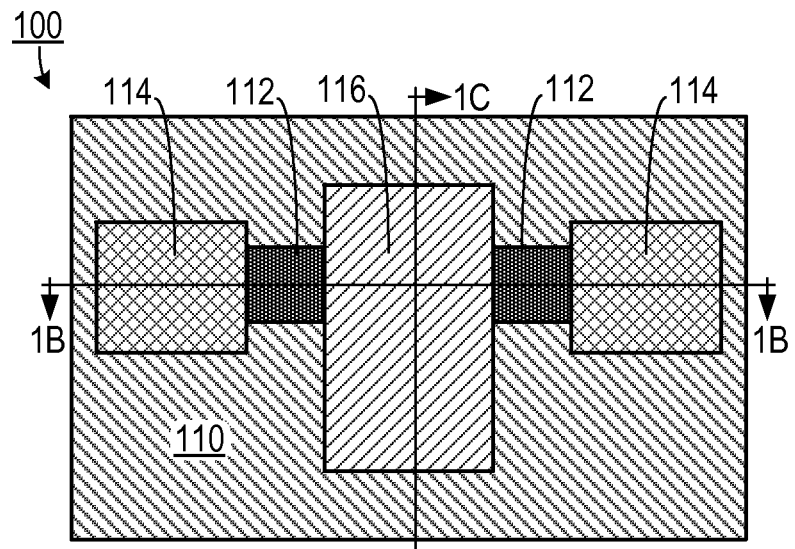
FIG. 1A is a top plan view of one embodiment of a graphene transistor.

A preferred embodiment of the invention is now described in detail. Referring to the drawings, like numbers indicate like parts throughout the views. Unless otherwise specifically indicated in the disclosure that follows, the drawings are not necessarily drawn to scale. As used in the description herein and throughout the claims, the following terms take the meanings explicitly associated herein, unless the context clearly dictates otherwise: the meaning of "a," "an," and "the" includes plural reference, the meaning of "in" includes "in" and "on." Methods of generating an patterning a graphene ribbon are disclosed in U.S. Pat. No. 7,015,142, issued to deHeer et al., which is hereby incorporated by reference.

Figure 1B:
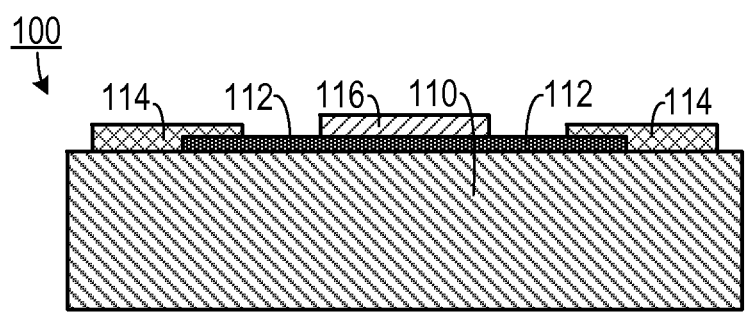
FIG. 1B is a cross-sectional view of the embodiment shown in FIG. 1A, taken along line 1B-1B.
Figure 1C:
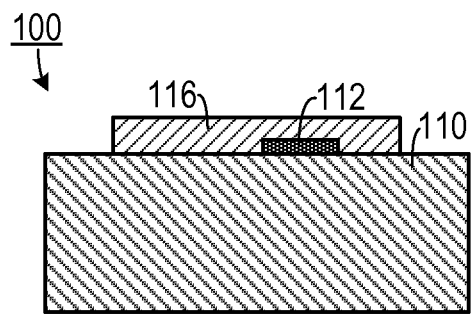
FIG. 1C is a cross-sectional view of the embodiment shown in FIG. 1A, taken along line 1C-1C.
Figure 2:
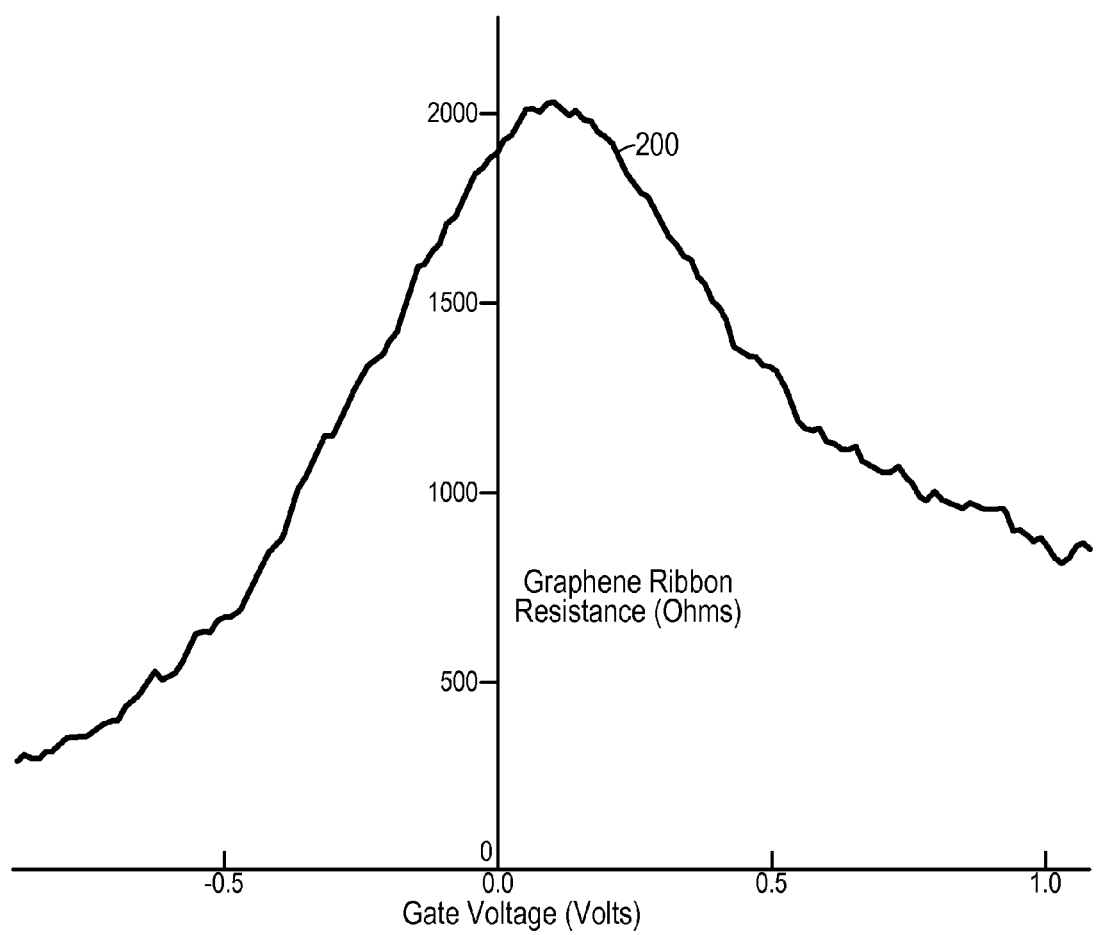
FIG. 2 is a graph showing resistance as a function of gate voltage in one experimental embodiment.

As shown in FIGS. 1A-1C, one embodiment of a gated electrical device 100, such as a field effect transistor, includes a non-conducting substrate 110, such as silicon oxide or silicon carbide. A graphene ribbon 112 (or other graphene structure) is disposed on the non-conducting substrate 110. A metal layer 116 is deposited onto the graphene ribbon 112. The metal layer 116 includes a metal that exhibits a large contact resistance at its interface with the graphene ribbon 112. Two electrical contacts 114 are deposited at the ends of the graphene ribbon 112. The electrical contacts 114 include a material that has a relatively low contact resistance with the graphene ribbon 112. In a transistor embodiment, the two metal contacts 114 can act as a source and a drain and the metal layer 116 can act as a gate.

One experimental embodiment employed a graphene ribbon 112 that was 1 µm wide and 10 µm long and grown on the surface of a silicon carbide crystal and patterned into the shape of a ribbon using known lithographic techniques (see, e.g., U.S. Pat. No. 7,015,142). The metal gate layer 116 included a 10 nm thick copper layer. (In one alternate embodiment, aluminum and similar metals can be used as the metal layer 116.) The electrical contacts 114 were metal leads that included a layer of titanium that was coated with a layer of gold. (Other materials may be used for the electrical contacts so long as such the interface between such materials and the graphene ribbon 112 exhibits low resistance.) The metal leads 114 made good electrical contact with the graphene ribbon 112 in contrast to the copper layer 116, which made poor electrical contact with the graphene layer 112.

The metal may be deposited using one of several different methods of the type typically used in the micro electronics industry. One method employs evaporation of the metal onto to graphene surface so that it condenses on the graphene. A mask is used to define where the metal is deposited. The metal may be subsequently heated (i.e., annealed) to improve the crystal quality of the metal.

A graph 200, as shown in FIG. 3, relates resistance measurements of the graphene ribbon embodied in a field effect transistor in the experimental embodiment as a function of a voltage applied to the gate. As can be seen, the resistance of the ribbon is modulated by the gate voltage such that relatively small changes to the gate electrode voltage cause relatively large resistance changes in the portion of the graphene ribbon that is in close proximity to the metal gate electrode.

In one method, a graphene layer (or multiple graphene layers) is gated by applying certain metals directly to the graphene layer so that it is in physical contact with the graphene. Certain metals (e.g., copper and aluminum) can be applied directly to the graphene layer without an interposing dielectric layer and can still function as a gate.

Despite the direct physical contact between the metal and the graphene, the contact resistance between the metal and the graphene layer is large so that a significant potential difference can be sustained between the two without it causing unacceptable large currents to flow between the two. Consequently, the metal layer on top of the graphene sheet can serve as a gate and function in a manner that is similar to existing electrostatic gates.

It has been experimentally determined that the electronic properties of the graphene are not significantly altered due to the application of a metal on top of the graphene layer. Hence, in this method there is no need to apply a dielectric layer on top of the graphene layer in the gate area. Two advantages of this method include. (1) the complications of applying a dielectric are circumvented; and (2) only small potential differences applied to the gate are required to produce relatively large conductivity changes in the graphene layer.

The physical reason that the contact resistance between the metal layer and the graphene sheet are relatively large can be explained by properties of the materials. In one explanation, the Fermi surface in momentum space of a lightly doped graphene layer consists of 6 circles that are positioned in a hexagonal pattern. The Fermi surface of a gate metal layer lies within the hexagonal pattern of the Fermi surface of the graphene layer. As a result, the transfer of an electron from the metal to the graphene requires a substantial potential difference and, thus, the contact resistance is relatively large. Other physical mechanisms may also apply as well.

The scope of this invention may include many electrical structures (including metal structures, conducting polymer structures, and metal alloy structures) of many different shapes. The scope of this invention may also include methods to modify the work function of the metal layer on top of the graphene, in which the charge density on the graphene layer is modified as well. This will allow the graphene to be electrically biased without applying a voltage to the metal layer. For example, a thin copper layer may be applied to the graphene layer on top of which an aluminum layer is applied so that the work function of the resulting metal layer is modified, which will change the charge density in the graphene layer.

While the metal gate layer is deposited directly on the graphene ribbon, it is possible that the graphene, the metal gate layer, or both are modified (e.g., oxidized by an ambient gas) during or after the depositional process and that this modification results in the desirable properties of this invention. Additional treatments to the metal and the graphene ribbon may create desirable effects. Such treatments may include: heating the metal coated graphene; exposing the metal coated graphene to gasses in order to modify the graphene/metal interface; and exposing the metal coated graphene to chemical either in a liquid or a gaseous state to modify the graphene/metal interface. It is intended that the scope of claims below extend to all embodiments disclosed here, including embodiments in which the graphene ribbon or the metal gate are modified during the depositional process.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A gated electrical device, comprising:
   a. a non-conductive substrate;
   b. a flat graphene structure disposed on the non-conductive substrate;
   c. a metal gate deposited directly on a portion of the flat graphene structure, the metal gate including a first metal that has a high contact resistance with graphene wherein the first metal comprises copper; and
   d. two electrical contacts, each placed on the flat graphene structure so that the metal gate is disposed between the two electrical contacts.

2. The gated electrical device of claim 1, wherein the substrate comprises a material selected from a group consisting of: silicon oxide and silicon carbide.

3. The gated electrical device of claim 1, wherein the graphene structure comprises a graphene ribbon.

4. The gated electrical device of claim 1, wherein the graphene structure comprises a single layer of graphene.

5. The gated electrical device of claim 1, wherein the graphene structure comprises a plurality of layers of graphene.

6. The gated electrical device of claim 1, wherein the graphene structure has a Fermi surface that includes a hexagonal pattern and wherein the first metal has a Fermi surface that lies within the hexagonal pattern of the Fermi surface of the graphene.

7. The gated electrical device of claim 1, wherein the two electrical contacts include a second metal that has a low contact resistance with graphene.

8. The gated electrical device of claim 7, wherein the second metal comprises a titanium layer.

9. The gated electrical device of claim 8, wherein the titanium layer is coated with gold.

10. A gated electrical device, comprising:
   a. a silicon oxide substrate;
   b. a graphene ribbon disposed on the substrate, the graphene ribbon including at least one layer of graphene;
   c. a copper gate layer deposited directly on a portion of the graphene structure; and
   d. two electrical contacts, each placed on the graphene structure so that the metal gate is disposed between the electrical contacts, the electrical contacts including titanium coated with gold.

11. A method of making a gated electrical device, comprising the steps of:
   a. disposing a flat graphene structure onto a non-conductive substrate;
   b. depositing a metal gate directly on a portion of the flat graphene structure, the metal gate including a first metal that has a high contact resistance with graphene wherein the first metal comprises copper; and
   c. depositing two electrical contacts on the flat graphene structure so that the metal gate is disposed between the two electrical contacts.

12. The method of claim 11, wherein the substrate comprises a material selected from a group consisting of: silicon oxide and silicon carbide.

13. The method of claim 11, wherein the graphene structure comprises a graphene ribbon.

14. The method of claim 11, wherein the graphene structure comprises a single layer of graphene.

15. The method of claim 11, wherein the graphene structure comprises a plurality of layers of graphene.

16. The method of claim 11, wherein the graphene structure has a Fermi surface that includes a hexagonal pattern and further comprising the step of selecting the first metal so that the first metal has a Fermi surface that lies within the hexagonal pattern of the Fermi surface of the graphene.

17. The method of claim 11, wherein the electrical contacts include a second metal that has a low contact resistance with graphene.

18. The method of claim 17, wherein the second metal comprises a titanium layer.

19. The method of claim 18, further comprising the step of coating the titanium layer with gold.

\* \* \* \* \*